United States Patent [19]

Inada et al.

[11] Patent Number: 5,413,982
[45] Date of Patent: * May 9, 1995

[54] FIELD EFFECT TRANSISTOR HAVING C-AXIS CHANNEL LAYER

[75] Inventors: Hiroshi Inada; So Tanaka; Michitomo Iiyama, all of Osaka, Japan

[73] Assignee: Sumitomo Electric Industries, Ltd., Osaka, Japan

[*] Notice: The portion of the term of this patent subsequent to Aug. 17, 2010 has been disclaimed.

[21] Appl. No.: 990,836

[22] Filed: Dec. 14, 1992

[30] Foreign Application Priority Data

Dec. 13, 1991 [JP] Japan .................. 3-352196
Dec. 13, 1991 [JP] Japan .................. 3-352198
Dec. 10, 1992 [JP] Japan .................. 4-352660

[51] Int. Cl.$^6$ .............. H01B 12/00; H01L 39/22; B05D 5/12
[52] U.S. Cl. ................. 505/193; 257/35; 257/38; 257/39; 505/234; 505/235; 505/237; 505/239; 427/62; 427/63
[58] Field of Search .......... 257/33, 35, 36, 37, 257/39; 427/62, 63; 505/1, 700, 701, 702, 874, 191–193, 233–239

[56] References Cited

U.S. PATENT DOCUMENTS 5,087,605 2/1992 Hedge et al. .................. 257/661

FOREIGN PATENT DOCUMENTS 0506570 9/1992 European Pat. Off. .
2661557 10/1991 France .
63-269585 11/1988 Japan .
01170080 7/1989 Japan .

OTHER PUBLICATIONS

Eidelloth, W., et al., "Wet Etch Process for Patterning Insulators Suitable for Epitaxial High $T_c$ Superconducting Thin Film Multilevel Electronic Circuits", *Applied Physics Letters*, vol. 59, No. 10, pp. 1257–1259, Sep. 1991.

Wu et al., "High Critical Currents in Epitaxial YBaCuO Thin Films on Silicon with Buffer Layers," Appl. Phys. Lett, vol. 54, No. 8, 20 Feb. 1989 pp. 754–755.

*Primary Examiner*—Mahshid D. Saadat
*Attorney, Agent, or Firm*—Foley & Lardner

[57] ABSTRACT

A superconducting device comprising a substrate having a principal surface, a non-superconducting oxide layer having a similar crystal structure to that of the oxide superconductor, an extremely thin superconducting channel formed of a c-axis oriented oxide superconductor thin film on the non-superconducting oxide layer, a superconducting source region and a superconducting drain region formed of an a-axis oriented oxide superconductor thin film at the both sides of the superconducting channel separated from each other, which are electrically connected each other by the superconducting channel, so that superconducting current can flow through the superconducting channel between the superconducting source region and the superconducting drain region, and a gate electrode of a material which includes silicon through a gate insulator on the superconducting channel for controlling the superconducting current flowing through the superconducting channel, in which the gate electrode is embedded between the superconducting source region and the superconducting drain region and is isolated from the superconducting source region and the superconducting drain region by an insulating region formed by diffused silicon from the gate electrode.

15 Claims, 4 Drawing Sheets

FIELD EFFECT TRANSISTOR HAVING C-AXIS CHANNEL LAYER

BACKGROUND OF THE INVENTION

1. Field of the invention

The present invention relates to a method for patterning a layer on an oxide superconductor thin film and a superconducting device manufactured by the method, and more specifically to a method for patterning a layer on an oxide superconductor thin film without degrading the oxide superconductor thin film, and a superconducting device manufactured by the method.

2. Description of Related Art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature.

Josephson device is one of well-known superconducting devices. However, since Josephson device is a two-terminal device, a logic gate which utilizes Josephson devices becomes complicated. Therefore, three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulating layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to a superconducting proximity effect, and is controlled by an applied gate voltage. This type of the super-FET operates at a higher speed with a low power consumption.

The second type of the super-FET includes a channel of a superconductor formed between a source electrode and a drain electrode, so that a current flowing through the superconducting channel is controlled by a voltage applied to a gate formed above the superconducting channel.

Both of the super-FETs mentioned above are voltage controlled devices which are capable of isolating output signal from input one and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few ten nanometers, if the superconductor source electrode and the superconductor drain electrode are formed of the oxide superconductor material. However, it is very difficult to conduct a fine processing such as a fine pattern etching, so as to satisfy the very short separation distance mentioned above.

On the other hand, the super-FET having the superconducting channel has a large current capability, and the fine processing which is required to product the first type of the super-FET is not needed to product this type of super-FET.

In order to obtain a complete ON/OFF operation, both of the superconducting channel and the gate insulating layer should have an extremely thin thickness. For example, the superconducting channel formed of an oxide superconductor material should have a thickness of less than five nanometers and the gate insulating layer should have a thickness more than ten nanometers which is sufficient to prevent a tunnel current.

In the super-FET, since the extremely thin superconducting channel is connected to the relatively thick superconducting source region and the superconducting drain region at their lower portions, the superconducting current flows substantially horizontally through the superconducting channel and substantially vertically in the superconducting source region and the superconducting drain region. Since the oxide superconductor has the largest critical current density $J_c$ in the direction perpendicular to c-axes of its crystal lattices, the superconducting channel is preferably formed of a c-axis oriented oxide superconductor thin film and the superconducting source region and the superconducting drain region are preferably formed of a-axis oriented oxide superconductor thin films.

In a prior art, in order to manufacture the super-FET which has the superconducting channel of c-axis oriented oxide superconductor thin film and the superconducting source region and the superconducting drain region of a-axis oriented oxide superconductor thin films, a c-axis oriented oxide superconductor thin film is formed at first and the c-axis oriented oxide superconductor thin film is etched and removed excluding a portion which will be the superconducting channel. Then, an a-axis oriented oxide superconductor thin film is deposited so as to form the superconducting source region and the superconducting drain region.

In another prior art, at first an a-axis oriented oxide superconductor thin film is deposited and etched so as to form the superconducting source region and the superconducting drain region, and then a c-axis oriented oxide superconductor thin film is deposited so as to form the superconducting channel.

In the above methods, the oxide superconductor thin film is mostly processed by photolithography. Namely, the oxide superconductor thin film is masked by a photoresist and etched by a wet etching process using a weak $H_3PO_4$ solution, or a dry etching process such as a reactive ion etching or an ion-milling using Ar ions. In order to process the oxide superconductor thin film without degradation, the oxide superconductor thin film should be prevented from contacting with water. Since the oxide superconductor has high reactivity so as to react with water and is degraded. Therefore, these etching process use little water.

However, an oxide superconductor also reacts with photoresist remover so that a surface of the oxide superconductor thin film on which a photoresist is formed and removed is roughened. It is very difficult to deposit another thin film or layer on the rough surface of the oxide superconductor thin film so as to manufacture a superconducting device or a superconducting circuit of a multi-layer structure. In addition, if another oxide superconductor thin film is formed so as to contact the rough surface, an undesirable Josephson junction or a resistance is generated at the interface. Furthermore, superconducting characteristics of the reacted oxide superconductor thin film is affected, so that the superconducting device does not have an enough performance.

SUMMARY OF THE INVENTION

Accordingly, it is an object of the present invention to provide a method for patterning a layer on an oxide superconductor thin film, which have overcome the above mentioned defects of the conventional ones.

Another object of the present invention is to provide a method for processing an oxide superconductor thin film, which have overcome the above mentioned defects of the conventional ones.

Still another object of the present invention is to provide a method for manufacturing an FET type superconducting device which have overcome the above mentioned defects of the conventional ones.

Another object of the present invention is to provide an FET type superconducting device having a superconducting region constituted of an extremely thin oxide superconductor film, which have overcome the above mentioned defects of the conventional ones.

The above and other objects of the present invention are achieved in accordance with the present invention by a method for patterning a layer which is formed on an oxide superconductor thin film characterized in that a weak HF solution, a buffer solution including HF or a mixture including HF is used for etching the layer.

Preferably, the HF concentration of the weak HF solution, the buffer solution including HF or the mixture including HF is 5 to 15 wt %. An oxide superconductors is not affected by this weak HF solution so that the exposed portion of the oxide superconductor thin film is not roughened.

According to another aspect of the present invention, there is provided a method for patterning an oxide superconductor thin film, comprising a step of forming a $SiO_2$ layer on the oxide superconductor thin film, patterning the $SiO_2$ layer so as to form the same pattern as that of the oxide superconductor thin film which will be patterned, etching the oxide superconductor thin film by using the patterned $SiO_2$ layer as a mask, and removing the $SiO_2$ layer by using a weak HF solution, a buffer solution including HF or a mixture including HF.

In this method, the HF concentration of the weak HF solution, the buffer solution including HF or the mixture including HF is preferably 5 to 15 wt %. This weak HF solution selectively etches $SiO_2$, therefore, the oxide superconductor thin film is not affected.

In one preferred embodiment, the $SiO_2$ layer is also patterned by using a weak HF solution, a buffer solution including HF or a mixture including HF.

According to still another aspect of the present invention, there is provided a method of manufacturing a superconducting device, comprising the steps of forming on a principal surface of a substrate a non-superconducting oxide layer having a similar crystal structure to that of a c-axis oriented oxide superconductor thin film, forming a c-axis oriented oxide superconductor thin film having an extremely thin thickness on the non-superconducting oxide layer, forming an insulating layer on the c-axis oriented oxide superconductor thin film, forming a gate electrode of polycrystalline silicon on a center portion of the insulating layer, etching the insulating layer by using the gate electrode so as to form a gate insulating layer under the gate electrode and forming an a-axis oriented oxide superconductor thin film so as to embed the gate electrode and to form an insulating region by diffused silicon from the gate electrode, and etching back the a-axis oriented oxide superconductor thin film so that an upper surface of the a-axis oriented oxide superconductor thin film is planarized and the gate electrode is exposed at the planarized upper surface of the a-axis oriented oxide superconductor thin film and a superconducting source region and superconducting drain region are formed at the both sides of the gate electrode.

It is preferable that the insulating layer is etched by using a weak HF solution, a buffer solution including HF or a mixture including HF. In this case, the superconducting channel of the extremely thin c-axis oriented oxide superconductor film is not affected by the etching process. Therefore, the superconducting device has a high performance.

According to further another aspect of the present invention, there is provided a superconducting device comprising a substrate having a principal surface, a non-superconducting oxide layer having a similar crystal structure to that of the oxide superconductor, an extremely thin superconducting channel formed of a c-axis oriented oxide superconductor thin film on the non-superconducting oxide layer, a superconducting source region and a superconducting drain region formed of an a-axis oriented oxide superconductor thin film at the both sides of the superconducting channel separated from each other, which are electrically connected each other by the superconducting channel, so that superconducting current can flow through the superconducting channel between the superconducting source region and the superconducting drain region, and a gate electrode of a material which includes silicon through a gate insulator on the superconducting channel for controlling the superconducting current flowing through the superconducting channel, in which the gate electrode is embedded between the superconducting source region and the superconducting drain region and is isolated from the superconducting source region and the superconducting drain region by an insulating region formed by diffused silicon from the gate electrode.

In the superconducting device in accordance with the present invention, superconducting current flows along the insulating region which is formed by diffused silicon and has a smooth profile next to the superconducting source region and the superconducting drain region, the superconducting current efficiently flows into and flows from the superconducting channel. Therefore, superconducting current flow into or from the superconducting channel efficiently so that the current capability of the super-FET can be improved.

The gate electrode is preferably formed of polycrystalline silicon, single crystalline silicon or silicide of a metal.

In the superconducting device in accordance with the present invention, the non-superconducting oxide layer preferably has a similar crystal structure to that of a c-axis oriented oxide superconductor thin film. In this case, the superconducting channel of a c-axis oriented oxide superconductor thin film can be easily formed on the non-superconducting oxide layer.

Preferably, the above non-superconducting oxide layers is formed of a $Pr_1Ba_2Cu_3O_{7-\epsilon}$ oxide. A c-axis oriented $Pr_1Ba_2Cu_3O_{7-\epsilon}$ thin film has almost the same crystal lattice structure as that of a c-axis oriented oxide superconductor thin film. It compensates an oxide superconductor thin film for its crystalline incompleteness at the bottom surface. Therefore, a c-axis oriented oxide superconductor thin film of high crystallinity can be easily formed on the c-axis oriented $Pr_1Ba_2Cu_3O_{7-\epsilon}$ thin film. In addition, the effect of diffusion of the constituent elements of $Pr_1Ba_2Cu_3O_{7-\epsilon}$ into the oxide superconductor thin film is negligible and it also prevents the diffusion from substrate. Thus, the oxide superconductor thin film deposited on the $Pr_1Ba_2Cu_3O_{7-\epsilon}$ thin film has a high quality.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if silicon is used as a substrate.

Preferably, the superconducting channel is formed of a c-axis oriented oxide superconductor thin film and the superconducting source electrode and the superconducting drain electrode are formed of a-axis oriented oxide superconductor thin films.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1F, the method in accordance with the present invention for patterning an oxide superconductor thin film will be described.

Figure 1A:
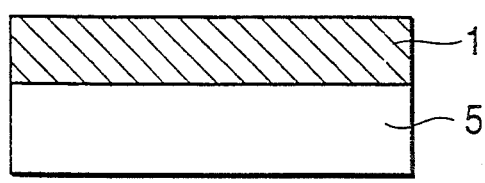
FIGS. 1A to 1F are diagrammatic sectional views for illustrating an embodiment of the method in accordance with the present invention for patterning an oxide superconductor thin film.

As shown in FIG. 1A, a $Y_1Ba_2Cu_3O_{7-\delta}$ oxide superconductor thin film 1 is deposited on a MgO (100) single crystalline substrate 5 having a substantially planar principal surface.

Figure 1B:
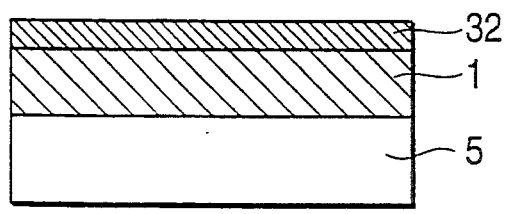

As shown in FIG. 1B, a $SiO_2$ layer 32 having a thickness of 200 nanometers is formed on the $Y_1Ba_2Cu_3O_{7-\delta}$ oxide superconductor thin film 1 by a CVD. The $SiO_2$ layer 32 is formed under a condition in which the substrate temperature is lower than 350° C.

Figure 1C:
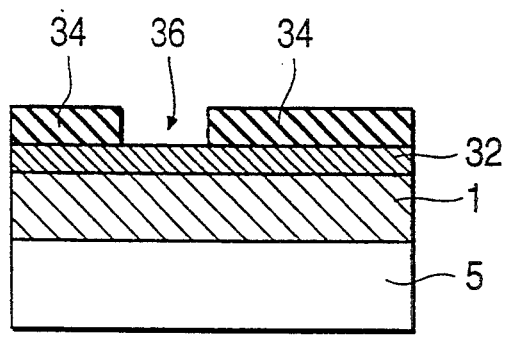

Then, as shown in FIG. 1C, a photoresist layer 34 having an opening 36 is formed on the $SiO_2$ layer 32 and a portion of the $SiO_2$ layer 32 is exposed at the opening 36. The portion of the $SiO_2$ layer 32 exposed at the opening 36 is etched by a wet etching using a 10% HF solution or a dry etching process such as a reactive ion etching, an ion-milling using Ar ions.

Figure 1D:
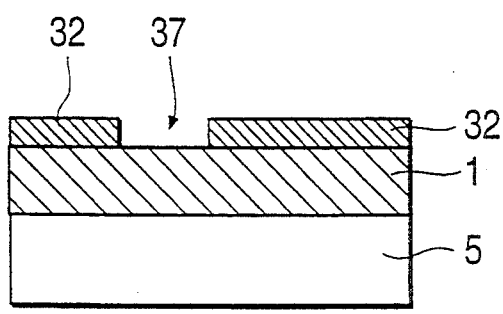

The portion of $SiO_2$ layer 32 is completely removed so that an opening 37 is formed and a portion of the $Y_1Ba_2Cu_3O_{7-\delta}$ oxide superconductor thin film 1 is exposed. Then, the photoresist 34 is removed, as shown in FIG. 1D. The portion of the $Y_1Ba_2Cu_3O_{7-\delta}$ oxide superconductor thin film 1 is affected by the photoresist remover at this time.

Figure 1E:
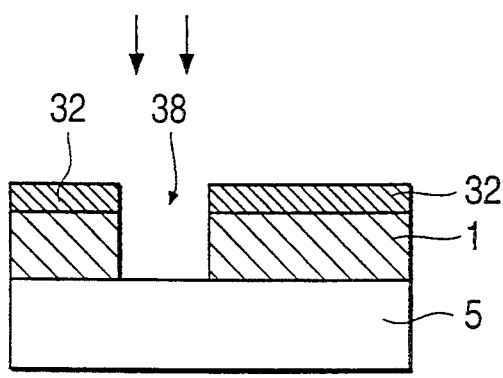

Thereafter, the portion of the $Y_1Ba_2Cu_3O_{7-\delta}$ oxide superconductor thin film 1 is etched by a wet etching using a 0.1% $H_3PO_4$ solution or a dry etching process such as a reactive ion etching, an ion-milling using Ar ions so that the portion of the $Y_1Ba_2Cu_3O_{7-\delta}$ oxide superconductor thin film 1 is completely removed and a portion 38 of the substrate 5 is exposed, as shown in FIG. 1E. The portion of the $Y_1Ba_2Cu_3O_{7-\delta}$ oxide superconductor thin film 1 which is degraded by the photoresist remover is removed simultaneously.

Figure 1F:
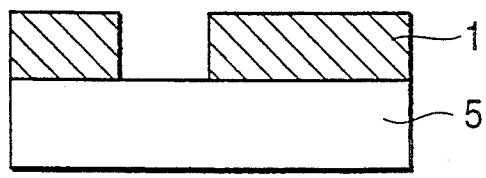

Finally, as shown in FIG. 1F, the remaining $SiO_2$ layer 32 is removed by using a 10% HF solution. This weak HF solution does not affect the $Y_1Ba_2Cu_3O_{7-\delta}$ superconductor thin film 1. Therefore, the surface of the $Y_1Ba_2Cu_3O_{7-\delta}$ oxide superconductor thin film is not roughed and is as smooth as that of an as-grown $Y_1Ba_2Cu_3O_{7-\delta}$ oxide superconductor thin film. Also, the superconducting characteristics of the $Y_1Ba_2Cu_3O_{7-\delta}$ oxide superconductor thin film is not affected.

As explained above, if an oxide superconductor thin film is patterned in accordance with the embodiment of the method of the present invention, the surface of the oxide superconductor thin film is not roughened and the superconducting characteristics is not affected. Therefore, another thin film or layer can be easily formed on the oxide superconductor thin film so that a superconducting device or a circuit of a multi-layer structure is easily manufactured.

Embodiment 2

Referring to FIGS. 2A to 2J, the process in accordance with the present invention for manufacturing the super-FET will be described.

Figure 2A:
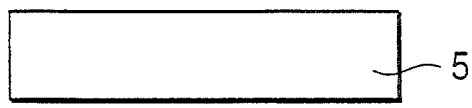
FIGS. 2A to 2J are diagrammatic sectional views for illustrating an embodiment of the method in accordance with the present invention for manufacturing the super-FET.

As shown in FIG. 2A, a MgO (100) single crystalline substrate 5 having a substantially planar principal surface ((100) surface) is prepared.

Figure 2B:
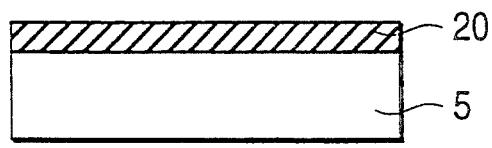

As shown in FIG. 2B, an oxide layer 20 having a thickness of 50 nanometers composed of a $Pr_1Ba_2Cu_3O_{7-\epsilon}$ thin film is deposited on the principal surface of the substrate 5, by an MBE. While the $Pr_1Ba_2Cu_3O_{7-\epsilon}$ thin film is growing, the surface morphology of the $Pr_1Ba_2Cu_3O_{7-\epsilon}$ thin film is monitored by RHEED. A condition of forming the $Pr_1Ba_2Cu_3O_{7-\epsilon}$ oxide thine film by MBE is as follows:

| Molecular beam source | Pr: 1225° C. |

|  |  |
| --- | --- |
|  | Ba: 600° C. |
|  | Cu: 1040° C. |
| Pressure | 1 × 10$^{-5}$ Torr |
| Temperature of the substrate | 750° C. |

Figure 2C:
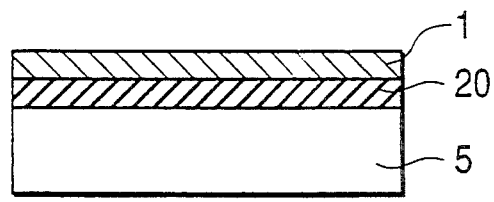

Then, the Pr molecular beam source is exchanged to a Y molecular beam source and the temperature of the substrate is lowered to 700° C. so that a c-axis oriented $Y_1Ba_2Cu_3O_{7-\delta}$ oxide superconductor thin film 1 having a thickness of about 5 nanometer is continuously formed on the oxide layer 20 of $Pr_1Ba_2Cu_3O_{7-\epsilon}$ thin film, as shown in FIG. 2C. A condition of forming the c-axis oriented $Y_1Ba_2Cu_3O_{7-\delta}$ oxide superconductor thin film 1 by MBE is as follows:

| Molecular beam source | Y: 1250° C. |
| --- | --- |
|  | Ba: 600° C. |
|  | Cu: 1040° C. |
| Pressure | 1 × 10$^{-5}$ Torr |
| Temperature of the substrate | 700° C. |

Figure 2D:
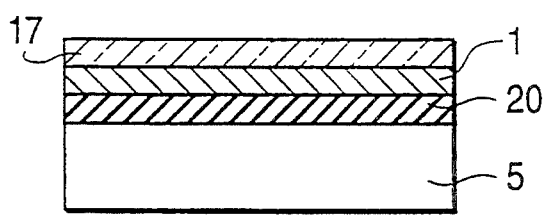
Figure 2E:
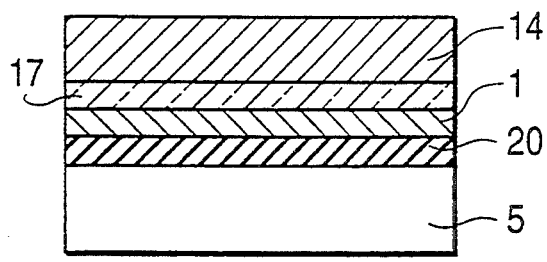

Then, as shown in FIG. 2D, an insulating layer 17 of $SrTiO_3$ having a thickness of 10 to 20 nanometers is formed on the c-axis oriented $Y_1Ba_2Cu_3O_{7-\delta}$ oxide superconductor thin film 1 by a sputtering. A polycrystalline silicon layer 14 having a thickness of 200 nonometers is formed on the insulating layer 17 by CVD, as shown in FIG. 2E.

Figure 2F:
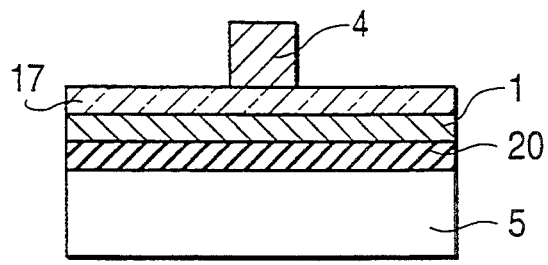
Figure 2G:
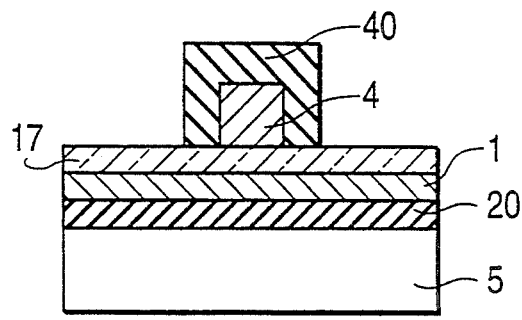

Thereafter, the polycrystalline silicon layer 14 is etched by a reactive ion etching so as to form a gate electrode 4, as shown in FIG. 2F. Then, the surfaces of the gate electrode 4 is oxidized so as to form a $SiO_2$ layer having a thickness of 50 to 100 nanometers, as shown in FIG. 2G.

Figure 2H:
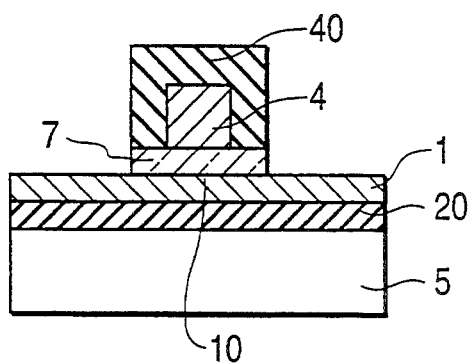

Thereafter, as shown in FIG. 2H, the insulating layer 17 of $SrTiO_3$ is etched so as to form a gate insulating layer 7 by using a mixture of HF and $NH_4OH$. The mixture of HF and $NH_4OH$ selectively etched the insulating layer 17 of $SrTiO_3$ and does not affect the $Y_1Ba_2Cu_3O_{7-\delta}$ oxide superconductor thin film 1. Therefore, the characteristics of the $Y_1Ba_2Cu_3O_{7-\delta}$ oxide superconductor thin film 1 is maintained. A portion of the $Y_1Ba_2Cu_3O_{7-\delta}$ oxide superconductor thin film 1 under the gate insulating layer 7 becomes a superconducting channel.

Figure 2I:
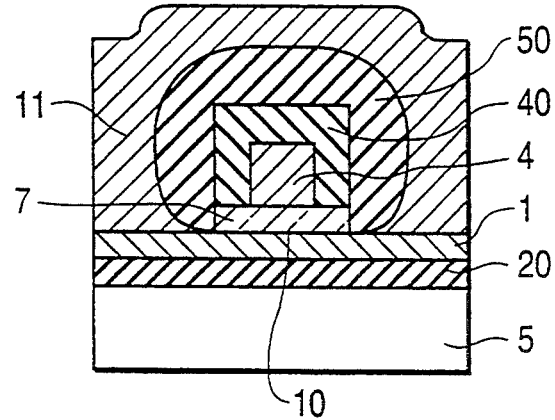

Thereafter, the substrate 5 is heated to a temperature of 350° to 400° C. under a pressure lower than $1 \times 10^{-9}$ Torr so as to clean the exposed surface of the $Y_1Ba_2Cu_3O_{7-\delta}$ oxide superconductor thin film 1. This heat treatment is not necessary, if the exposed surface of the c-axis oriented $Y_1Ba_2Cu_3O_{7-\delta}$ oxide superconductor thin film 1 is clean enough. Then, a a-axis oriented $Y_1Ba_2Cu_3O_{7-\delta}$ oxide superconductor thin film 11 having a thickness of 500 nanometers is deposited on the $Y_1Ba_2Cu_3O_{7-\delta}$ oxide superconductor thin film 1 by an off-axis sputtering so as to encapsulate the gate electrode 4, as shown in FIG. 2I. A condition of forming the $Y_1Ba_2Cu_3O_{7-\delta}$ oxide superconductor thin film 11 by an off-axis sputtering is as follows:

| Temperature of the substrate | 640° C. |
| --- | --- |
| Sputtering Gas | Ar: 90% |
|  | $O_2$: 10% |
| Pressure | 10 Pa |

While the $Y_1Ba_2Cu_3O_{7-\delta}$ oxide superconductor thin film 11 is deposited, silicon diffuses from the gate electrode 4 so as to form a insulating region 50 around the gate electrode 4. The insulating region 50 is formed of a $Y_1Ba_2Cu_3O_{7-\delta}$ oxide superconductor which does not show superconductivity by the diffused silicon.

Figure 2J:
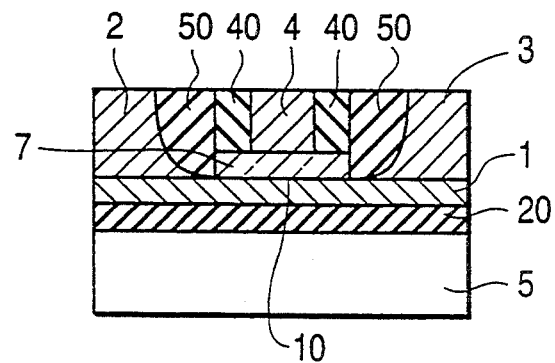

Finally, in order to planarize an upper surface of the $Y_1Ba_2Cu_3O_{7-\delta}$ oxide superconductor thin film 11, a photoresist layer (not shown) is coated on the $Y_1Ba_2Cu_3O_{7-\delta}$ oxide superconductor thin film 11 in such a manner that the deposited photoresist layer has a flat upper surface, and then, the coated photoresist layer and the $Y_1Ba_2Cu_3O_{7-\delta}$ oxide superconductor thin film 11 are etched back, until the upper surface of the $Y_1Ba_2Cu_3O_{7-\delta}$ oxide superconductor thin film 11 is planarized and the gate electrode 4 is exposed at the planarized upper surface of the $Y_1Ba_2Cu_3O_{7-\delta}$ oxide superconductor thin film 11, as shown in FIG. 2J. Portions of the $Y_1Ba_2Cu_3O_{7-\delta}$ oxide superconductor thin film 11 at the both sides of the gate electrode 4 become a superconducting source region 2 and a superconducting drain region 3.

Metal electrodes may be formed on the superconducting source region 2 and the superconducting drain region 3, if necessary. With this, the super-FET in accordance with the present invention is completed.

The superconducting channel of the above mentioned super-FET manufactured in accordance with the embodiment of the method of the present invention is formed on an oxide layer which has similar crystalline structure to that of the oxide superconductor. Therefore, the bottom portion of the superconducting channel is not degraded so that the substantial cross-sectional area of the superconducting channel of the super-FET is larger than that of a conventional super-FET.

Additionally, since superconducting current flows along the insulating region which is formed by diffused silicon next to the superconducting source region and the superconducting drain region, the superconducting current efficiently flows into and flows from the superconducting channel. By all of these, the current capability of the super-FET can be improved.

Furthermore, according to the present invention, the oxide layer, the superconducting channel, the gate insulating layer and the gate electrode are self-aligned. The insulating region 50 which isolates the gate electrode from the superconducting source region and the superconducting drain region is also automatically positioned. Therefore, the limitation in the fine processing technique required for manufacturing the super-FET is relaxed.

Additionally, according to the present invention, the gate insulating layer is formed by an etching process using a mixture of HF and $NH_4OH$. The mixture of HF and $NH_4OH$ selectively etched the insulating layer of $SrTiO_3$ on the oxide superconductor thin film which will constitutes the superconducting channel and does not affect the oxide superconductor thin film. Therefore, the superconducting characteristics of the oxide superconductor thin film is maintained.

In the above mentioned embodiment, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting device comprising:
   a substrate having a principal surface,
   a non-superconducting oxide layer having a crystal structure similar to that of an overlying c-axis oriented oxide superconducting channel,
   an overlying, c-axis oriented superconducting channel,
   a-axis oriented, compound oxide superconducting source and drain regions at each end of the superconducting channel, the source and drain regions being electrically connected to each other by the superconducting channel, so that superconducting current can flow through the superconducting channel between the superconducting source region and the superconducting drain region, the superconducting channel being of a thickness such that a complete ON/OFF operation is obtained,
   a gate insulator positioned between the superconducting channel and an overlying gate electrode, and
   a gate electrode of a material which includes silicon, the gate electrode being embedded between the superconducting source region and the superconducting drain region and being isolated from the superconducting source region and the superconducting drain region by insulating regions of compound oxide containing silicon.

2. A superconducting device as claimed in claim 1, wherein the non-superconducting oxide layer has a similar crystal structure to that of the overlying c-axis oriented oxide superconductor thin film.

3. A superconducting device as claimed in claim 2, wherein the non-superconducting oxide layer is formed of a $Pr_1Ba_2Cu_3O_{7-g}$ thin film.

4. A superconducting device as claimed in claim 1, wherein the gate electrode is formed of a material selected from the group consisting of polycrystalline silicon, single crystalline silicon or silicide of a metal.

5. A superconducting device as claimed in claim 1, wherein the oxide superconductor is formed of high-$T_c$ (high critical temperature) oxide superconductor.

6. A superconducting device as claimed in claim 5, wherein the oxide superconductor is formed of oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

7. A superconducting device as claimed in claim 1, wherein the substrate is formed of a material selected from the group consisting of a MgO (100) substrate, a $SrTiO_3$ (100) substrate and a $CdNdAlO_4$ (001) substrate, and a semiconductor substrate.

8. A superconducting device as claimed in claim 7, wherein the substrate is formed of a silicon substrate and a principal surface of the silicon substrate is coated with an insulating material layer which is formed of a $MgAl_2O_4$ layer and a $BaTiO_3$ layer.

9. A superconducting device as claimed in claim 1, wherein the oxide superconductor is formed of high-$T_c$ copper-oxide type compound oxide superconductor.

10. A superconducting device as claimed in claim 1, wherein the superconducting channel has a thickness of less than about 5 nanometers.

11. A superconducting device claimed in claim 10, wherein the gate insulating region has a thickness of about 10 to 20 nanometers.

12. A superconducting device as claimed in claim 1, wherein an interface between the insulating regions of compound oxide containing silicon and the superconducting source and drain regions has a smooth, curved profile.

13. A superconducting device as claimed in claim 12, wherein the curved profile is curved outwardly, relative to the gate electrode.

14. A superconducting device comprising:
    a substrate,
    a non-superconducting oxide layer having a crystal structure similar to that of an overlying, c-axis oriented oxide superconducting channel,
    a c-axis oriented superconducting channel,
    a-axis oriented, compound oxide superconducting source and drain regions at each end of the superconducting channel, the source and drain regions being electrically connected to each other by the superconducting channel, so that superconducting current can flow through the superconducting channel between the superconducting source and drain regions, the superconducting channel being of a thickness such that a complete ON/OFF operation is obtained,
    a gate insulator positioned between the superconducting channel and an overlying gate electrode,
    a gate electrode of a material which includes silicon, the gate electrode being embedded between the superconducting source region and the superconducting drain region so that the superconducting device has a planar upper surface, and
    insulating regions of compound oxide superconductor containing silicon on either side of the gate electrode that isolate the gate electrode from the superconducting source and drain regions, wherein an interface between each of the insulating regions of compound oxide containing silicon and the superconducting source and drain regions has a smooth, curved profile.

15. A superconducting device as claimed in claim 14, wherein the curved profile is curved outwardly, relative to the gate electrode.

* * * * *